United States Patent
Morse et al.

(10) Patent No.: US 8,057,988 B2
(45) Date of Patent: Nov. 15, 2011

(54) CATALYST FOR MICROELECTROMECHANICAL SYSTEMS MICROREACTORS

(75) Inventors: Jeffrey D. Morse, Martinez, CA (US); David A. Sopchak, Livermore, CA (US); Ravindra S. Upadhye, Pleasanton, CA (US); John G. Reynolds, San Ramon, CA (US); Joseph H. Satcher, Patterson, CA (US); Alex E. Gash, Brentwood, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 12/779,819

(22) Filed: May 13, 2010

(65) Prior Publication Data
US 2010/0221667 A1 Sep. 2, 2010

Related U.S. Application Data

(62) Division of application No. 11/119,047, filed on Apr. 28, 2005, now Pat. No. 7,744,830.

(60) Provisional application No. 60/566,775, filed on Apr. 29, 2004.

(51) Int. Cl.
*G03F 7/20* (2006.01)

(52) U.S. Cl. .......................................... 430/320; 216/2

(58) Field of Classification Search ........................ None
See application file for complete search history.

(56) References Cited

U.S. PATENT DOCUMENTS

| 5,753,385 | A | 5/1998 | Jankowski et al. |
| 6,492,014 | B1 | 12/2002 | Rolison et al. |
| 6,607,857 | B2 | 8/2003 | Blunk et al. |
| 2002/0006374 | A1 | 1/2002 | Kourtakis et al. |
| 2003/0039874 | A1 | 2/2003 | Jankowski et al. |
| 2003/0040173 | A1 | 2/2003 | Fonash et al. |
| 2003/0138685 | A1 | 7/2003 | Jankowski et al. |
| 2004/0179980 | A1* | 9/2004 | Pattekar et al. .............. 422/130 |
| 2005/0207953 | A1* | 9/2005 | Upadhye et al. .............. 422/240 |

FOREIGN PATENT DOCUMENTS

| DE | 198 41 993 A | * | 3/2000 |
| EP | 0 186 149 | | 7/1986 |
| EP | 0 629 442 B1 | | 4/1998 |

OTHER PUBLICATIONS

English language translation of DE 198 41 993 (Mar. 2000).*

* cited by examiner

*Primary Examiner* — John A. McPherson
(74) *Attorney, Agent, or Firm* — Eddie E Scott

(57) ABSTRACT

A microreactor comprising a silicon wafer, a multiplicity of microchannels in the silicon wafer, and a catalyst coating the microchannels. In one embodiment the catalyst coating the microchannels comprises a nanostructured material. In another embodiment the catalyst coating the microchannels comprises an aerogel. In another embodiment the catalyst coating the microchannels comprises a solgel. In another embodiment the catalyst coating the microchannels comprises carbon nanotubes.

14 Claims, 5 Drawing Sheets

CATALYST FOR MICROELECTROMECHANICAL SYSTEMS MICROREACTORS

CROSS-REFERENCE TO RELATED APPLICATIONS

This application is a divisional of application Ser. No. 11/119,047, filed Apr. 28, 2005, now U.S. Pat. No. 7,744,830 entitled "Catalyst for Microelectromechanical Systems Microreactors". This application claims the benefit of U.S. Provisional Application No. 60/566,775, filed Apr. 29, 2004, and entitled "Catalyst Formulations and Methods Thereof", which is incorporated herein by this reference.

STATEMENT AS TO RIGHTS TO INVENTIONS MADE UNDER FEDERALLY SPONSORED RESEARCH AND DEVELOPMENT

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to microreactors and more particularly to a catalyst for MicroElectroMechanical Systems (MEMS) microreactors.

2. State of Technology

U.S. Pat. No. 5,753,385 for hybrid deposition of thin film solid oxide fuel cells and electrolyzers issued May 19, 1998 to Alan F. Jankowski, Daniel M. Makowiecki, Glenn D. Rambach, and Erik Randich provides the following state of technology information, "Fuel cells are electrochemical devices that convert the chemical energy in hydrogen or carbon monoxide and oxygen (in air) to electricity. A solid oxide fuel cell (SOFC) consists of three basic components: an electrolyte separating an anode and cathode. A thin film solid oxide fuel cell (TFSOFC) offers improvements in cost, reliability, efficiency, power density and specific power over other fuel cells."

United States Patent Application No. 2003/0039874 by Alan F. Jankowski and Jeffrey D. Morse published Feb. 27, 2003 for MEMS-based thin-film fuel cells provides the following state of technology information, "Fuel cells typically consist of electrolyte materials based on either polymer (proton exchange type) or solid oxide materials, which are sandwiched between electrodes. The fuel cell operates when fuel (usually hydrogen) is delivered to one electrode, and oxygen to the other. By heating the electrode-electrolyte structure, the fuel and oxidant diffuse to the electrode-electrolyte interfaces where an electrochemical reaction occurs, thereby releasing free electrons and ions which conduct across the electrolyte. Typical fuel cells are made from bulk electrode-electrolyte materials which are stacked and manifolded using stainless steel or other packaging which is difficult to miniaturize. These systems are bulky, requiring labor intensive manual assembly, packaging and testing, and in the case of solid oxide materials, typically operate at high temperatures (>600° C.). If the electrode-electrolyte stack can be made very thin and deposited using thin film deposition techniques, the temperature of operation will be significantly lower, and the cost of integration, packaging and manufacturing can be reduced."

United States Patent Application No. 2003/0138685 by Alan F. Jankowski and Jeffrey D. Morse published Jul. 24, 2003 for MEMS-based thin-film fuel cells provides the following state of technology information, "The present invention combines an example of thin-film deposition technology, referenced above, with micro-electro-mechanical systems (MEMS) technology to produce a thin-film miniature fuel cell with microflow channels and full-integrated control circuitry, along with integrated resistive heaters for effectively heating the fuel cell such that it will yield and order of magnitude greater power density than any currently known fuel cell. Using this combined technology, thin-film fuel cell stacks can be produced to provide a small, compact miniature power source. The miniature fuel cells of this invention may be either solid oxide or solid polymer or proton exchange membrane electrolyte materials, and may also utilize catalyst layers between the electrodes and the electrolyte."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a microreactor comprising a microreactor body, a multiplicity of microchannels in the microreactor body, and a catalyst coating the microchannels. In one embodiment the catalyst coating the microchannels comprises a nanostructured material. In another embodiment the catalyst coating the microchannels comprises an aerogel. In another embodiment the catalyst coating the microchannels comprises a solgel. In another embodiment the catalyst coating the microchannels comprises carbon nanotubes.

The present invention also provides a method of producing a microreactor comprising the steps of providing a silicon wafer, coating a photoresist on the silicon wafer, using a mask with UV exposure to develop a desired pattern in the photoresist, anisotropic etching the silicon wafer to produce microchannels in the silicon wafer, aligning a substrate over the microchannels in the silicon wafer, bonding the silicon wafer and the substrate, and coating the microchannels with a catalyst.

The present invention has use for producing improved microreactors having microchannels coated with a catalyst. The improved microreactors have use for fuel processors for portable fuel cell power sources, for catalytic combustion, for emission control devices, and nay other equipment or systems that include microreactors.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1A:
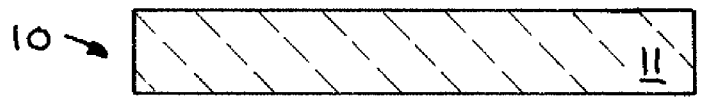
FIGS. 1A through 1G illustrate a catalyst system of the present invention.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Referring now to the drawings, and in particular to FIGS. 1A through 1G, a catalyst system of the present invention is illustrated. The catalyst system is designated generally by the reference numeral 10. The catalyst system 10 can be used for forming a catalyst bed having high aspect ratio microchannel arrays or on providing a microporous membrane that can be used to form an integrated catalyst bed. The catalyst system 10 provides a catalyst which coats the sidewalls of high aspect ratio flow channels of a chemical microreactor providing a high surface area coating that has high catalytic activity under nominal operating conditions. Systems for forming the catalyst coating for microchannel arrays includes vacuum deposition, electrodeposition, solgel, washcoat, or other ion exchange and doping approaches and the nature of the integrated chemical microreactor requires a coating that can be placed somewhat uniformly over the surface of a high aspect ratio microchannel array having channel widths as small as 50 μm. While such microreactors are formed using MEMS or micromachining techniques in which the high aspect ratio microchannels are formed in a silicon substrate, then bonded to another glass or silicon substrate to create an enclosed microchannel array network, the application of the above-mentioned catalyst formulations and methods can be used for microreactors and reformers made from ceramic, glass, or metal structures as well. Furthermore, the catalyst coatings on the microchannel sidewalls have open porosity with stable catalyst sites exposed. This is achieved by forming a high surface area, porous support structure for the catalyst, while determining stable formulations that limit degradation due to oxidation, reduction, or thermal sintering effects, and have stable adhesion to the reactor channel sidewalls and volumes.

Figure 1B:
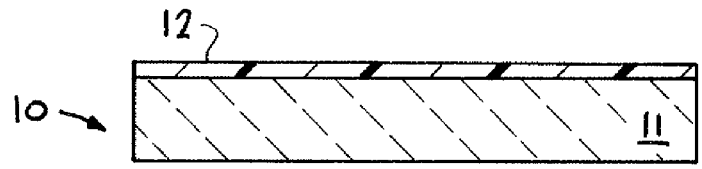
Figure 1C:
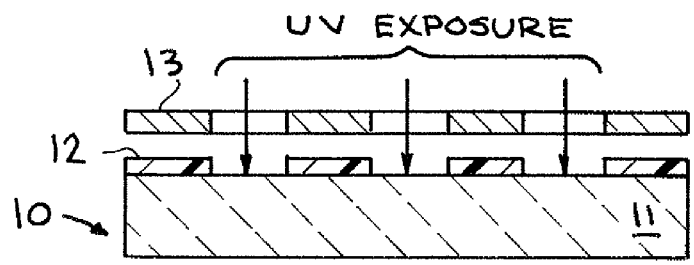
Figure 1D:
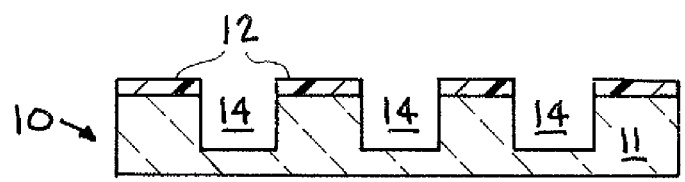
Figure 1E:
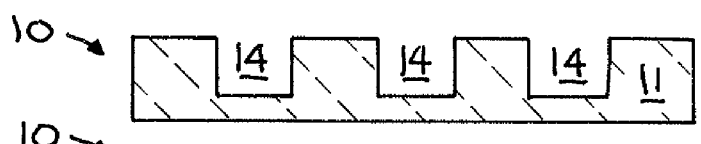
Figure 1F:
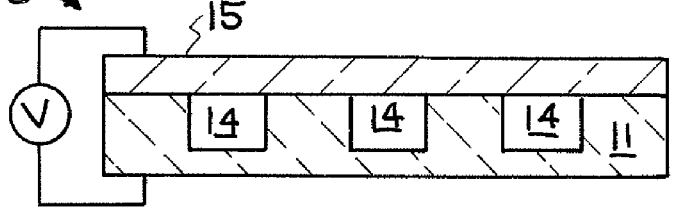
Figure 1G:
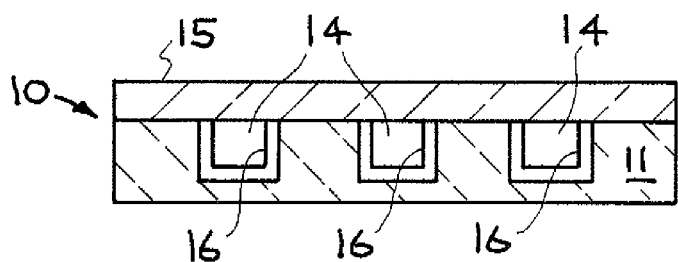

As illustrated in FIGS. 1A through 1G, the catalyst system 10 comprises a series of process steps that result in a microreactor with a catalyst coating microchannels in the microreactor. As shown in FIG. 1A, a silicon wafer 11 is provided that has the basic shape and size of the desired microreactor. As shown in FIG. 1B, a photoresist 12 is coated on the silicon wafer 11. As shown in FIG. 1C, a mask 13 is used over the photoresist 12 with UV exposure to develop the desired pattern in the photoresist 12. As shown in FIG. 1D, an anisotropic etch of the silicon wafer 11 produces the microchannels 14 in the silicon wafer 11. The anisotropic etch may be a dry plasma anisotropic etch or a wet chemical anisotropic etch. As shown in FIG. 1E, the silicon wafer 11 with the microchannels 14 is then processed to strip any remaining photoresist and the clean the surfaces of the silicon wafer 11. The step shown in FIG. 1E, wherein the silicon wafer 11 with the microchannels 14 is processed to strip any remaining photoresist and the clean the surfaces of the silicon wafer 11 is an optional cleaning step and is not required for the invention. As shown in FIG. 1F, a glass or silicon substrate 15 is aligned over the microchannels 14 in the silicon wafer 11. The silicon wafer 11 and glass or silicon substrate 15 are anodic bonded (500° C., 800V) or fusion bonded (>1000° C.) together. As shown in FIG. 1G, the microchannels 14 are then coated with the catalyst 16.

The catalyst system 10 is used to formulate the composition of the catalyst 16 to include a specified fraction of support material, catalyst materials, and in specific embodiments, adhesive or binding materials in a liquid solution or chemical mixture. The liquid solution is then applied to the sidewalls of the microchannels 14 in one of two methods. In one method, a liquid catalyst solution is applied to one end of the microchannel array using a pipette or other system and then the channels are enclosed by wafer bonding. The liquid is wetted onto the surface of the microchannels 16 by surface tension, and uniform coating over the dimension of the channels is achieved through capillary forces that spread the catalyst and support solution. Once coated, the catalyst materials are baked, leaving behind a high surface area support with uniformly dispersed catalyst. In a second method, the wafer 11 is first bonded together, enclosing the microchannels 14. The catalyst solution is then injected in the inlet until the entire microchannel array is filled, i.e., until the solution flows to the outlet. The subsequent steps used to dry or critically extract the liquid in the catalyst solution ultimately leave a porous catalyst and support layer residing on the microchannel sidewalls.

The properties of the catalyst coating and support material are achieved through control of composition, application of the material to the structure or microchannel catalyst bed, and final drying steps. Solgel or aerogel (super critically dried sol-gels) formulations are nanostructured materials that are constructed of 10 to 50 Å spherical subunits organized into a three dimensional porous arrays with high surface area and porosity. These materials can be applied and used as thin films. For example, a reforming catalyst can comprise a Ni-silica aerogel or CuZnO-alumina aerogel. Either aerogel can utilize any carbonaceous materials as the fuel although methanol is preferred. Other catalyst support materials include zirconia, alumina, coria, calcia or silica, and combinations thereof. Catalyst supports can also be made from other composite materials, such as zeolites, which form openly porous, high surface area layers and coatings through liquid, dispersible, solution-based formulations. Other materials and processes which are similar in nature and result in the similar end support structures would be possible for those skilled in the art of catalyst fabrication methods. Other examples of high surface area support materials include carbon nanotubes, carbon aerogels, and other openly porous materials formed by first mixing a solution, then reacting and/or baking to establish the necessary materials properties.

Figure 2:
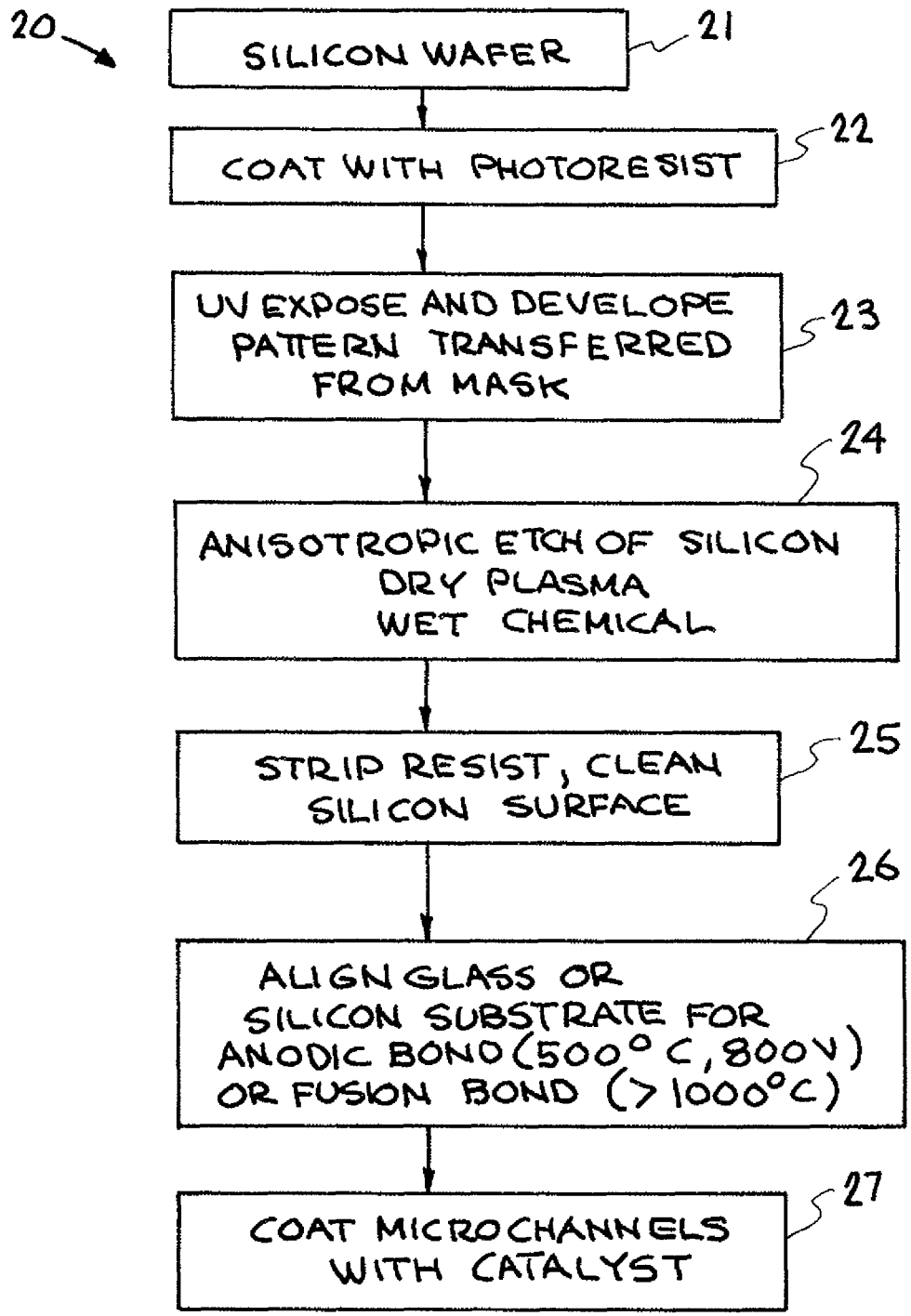
FIG. 2 is a flow chart illustrating the catalyst system of the present invention.

Referring now to FIG. 2, a flow chart illustrating the catalyst system is shown. The flow chart is designated generally by the reference numeral 20. The flow chart 20 further illustrates the catalyst system 10 shown in FIG. 1.

As illustrated in the flow chart 20 the catalyst system comprises a series of steps. In step 21, the silicon wafer is provided that has the basic shape and size of the desired microreactor. In step 22, the photoresist is coated on the silicon wafer.

In step 23, the mask 13 is used over the photoresist with UV exposure to develop the desired pattern in the photoresist. In step 24, the anisotropic etch of the silicon wafer produces the microchannels in the silicon wafer. The anisotropic etch can be made with a dry plasma or a wet chemical. In step 25, the silicon wafer with the microchannels is processed to strip any remaining photoresist and the clean the surfaces of the silicon wafer. The step 25 wherein the silicon wafer with the microchannels is processed to strip any remaining photoresist and the clean the surfaces of the silicon wafer is an optional cleaning step and is not required for the invention. In step 26, the glass or silicon substrate is aligned over the microchannels in the silicon wafer. The silicon wafer and glass or silicon substrate are anodic bonded (500° C., 800V) or fusion bonded (>1000° C.) together. In step 27, the microchannels are coated with the catalyst. The step of coating the microchannels with the catalyst can be performed in one of two methods.

In one method, a liquid catalyst solution is applied to one end of the microchannel array using a pipette or other system and then the channels are enclosed by wafer bonding. The liquid is wetted onto the surface of the microchannels by surface tension, and uniform coating over the dimension of the channels is achieved through capillary forces that spread the catalyst and support solution. Once coated, the catalyst materials are baked, leaving behind a high surface area support with uniformly dispersed catalyst.

In a second method, the wafer is first bonded together, enclosing the microchannels. The catalyst solution is then injected in the inlet until the entire microchannel array is filled, i.e., until the solution flows to the outlet. The subsequent steps used to dry or critically extract the liquid in the catalyst solution ultimately leave a porous catalyst and support layer residing on the microchannel sidewalls.

The properties of the catalyst coating and support material are achieved through control of composition, application of the material to the structure or microchannel catalyst bed, and final drying steps. Solgel or aerogel (super critically dried sol-gels) formulations are nanostructured materials that are constructed of 10 to 50 Å spherical subunits organized into a three dimensional porous arrays with high surface area and porosity. These materials are applied and used as thin films. For example, a reforming catalyst comprises a Ni-silica aerogel or CuZnO-alumina aerogel. Either aerogel can utilize any carbonaceous materials as the fuel although methanol is preferred. Other catalyst support materials include zirconia, alumina, ceria, calcic or silica, and combinations thereof.

Catalyst supports can also be made from other composite materials, such as zeolites, which form openly porous, high surface area layers and coatings through liquid, dispersible, solution-based formulations. Other materials and processes which are similar in nature and result in the similar end support structures would be possible for those skilled in the art of catalyst fabrication methods. Other examples of high surface area support materials include carbon nanotubes, carbon aerogels, and other openly porous materials formed by first mixing a solution, then reacting and/or baking to establish the necessary materials properties.

In one embodiment, the support material is first coated onto the sidewalls of the microchannel catalyst bed and baked to form a high surface area support coating. Then the catalyst is impregnated or dispersed onto the support material by flowing a solution containing the catalyst formulation through the microchannels. The support material is coated onto the microchannels sidewalls by flowing a solgel or washcoat through the channels and baking, or by depositing an aluminum thin film onto the sidewalls and anodizing to form a porous alumina coating.

The catalysts are nanostructured, allowing the catalytic metals to be uniformly dispersed on a molecular scale. This property and the open foam gas permeable tertiary structure leads to a much more efficient catalysis (based on metals content), and materials that can be used in thin film applications.

In the case of washcoats, the precursors utilize a nanoscale sized precursor mixed in appropriate formulations in which the catalytic metals are homogeneously dispersed. Upon drying and calcining of the catalyst coatings, a high surface area supporting structure is obtained that has finely dispersed catalyst sites.

Catalyst Composition and Preparation—The chemistry to form specified catalyst compositions for the reforming of methanol and water to hydrogen and carbon dioxide, for use in a fuel cell will be described. The catalyst solution is applied to the inside of a MEMS device as described above to provide a chemical microreactor, with the catalyst material being supported by an alumina, ceria, zirconia, calcic, silica, or carbon matrix in the form of a sol-gel, aerogel or fine particulate washcoat. In the case of alumina, a gamma-phase alumina is preferred as a catalyst support structure because it provides both a high surface area and stable surface for catalyst particles. In the case of carbon, carbon nanotubes or aerogel can be formed as the sidewall coating. Additionally, the catalyst formulation and method can be applied to alternative fuel processor and microreactor structures formed in materials and structures made from ceramic, glass, or metals. The microreactors can have channels and critical features for catalyst beds ranging from 10 μm to 10 mm.

In one embodiment, chemicals for the reformer catalyst and support matrix include copper, zinc, zirconium, nickel, chromium, cobalt, cerium, silicon, silica, titanium, and aluminum nitrates, acetates, chlorides, oxychlorides or other soluble salts, oxides thereof, and various compositions thereof. The reformer catalyst can be prepared by the precipitation of the metals or their hydroxides by the addition of the catalyst and support matrix metal salts to solutions containing sodium carbonate or sodium hydroxide. The resultant precipitate is then washed and air dried.

In another embodiment, the catalyst precursor salts are mixed with an alumina, zirconia, silica, or coria washcoat slurry and undergo thermal decomposition into the active catalysts when the catalyst and support matrix are baked out at temperatures in the 400-600° C. range in order to fix them to the reactor channels. The optimal reforming catalyst compositions contain up to 40% copper and 40% Zn by weight, with about 30% of each component being nominal for methanol reforming. Similar formulations may comprise 20-40% support material, and 60-80% catalyst for hydrocarbon fuel processing.

Catalyst supports for the catalytic heater are the same types as for the reformer. Platinum tetrachloride, tetramine and chloroplatinic acid can all be used as precursors for the platinum catalyst on the support matrix. Typical compositions contain up to 20% by weight of platinum catalyst on the support material.

Catalyst supports for the preferential oxidizer (PROX, to oxidize CO to $CO_2$ and leave the hydrogen relatively unchanged) are the same types as for the reformer. Ruthenium trichloride and nitrate and chloroiridic acid ($H_2IrCl_6$) can be used as precursors of the ruthenium and iridium PROX catalysts. Typical compositions contain up to 30% by weight of catalyst materials on the support material.

The catalytic heater and PROX catalysts can be reduced from their salts by solution-phase reduction using a suitable reducing agent, such as a slightly over stoichiometric amount of hydrazine, or after baking out the support by passing a hydrogen stream through the reactor bed at elevated temperature, e.g., 300° C. for several minutes.

Catalysts supports can also be designed by sol-gel and aerogel methods (such as Pt/Si/Ce/Ti aerogel) where the catalytic site is incorporated into the sol-gel or aerogel structure, then applied by traditional coating methods, such as in a washcoat. The catalyst support material can be first coated into the microchannels by sol-gel methods and critically dried to coat the channel sidewalls. The catalyst materials are then applied by wash-coating a solution containing the catalyst composition through the channels, in essence doping or impregnating the catalyst sites within the porous support matrix. Subsequent baking of the material further stabilizes the catalyst and support materials, forming a rugged, stable sidewall coating onto the microchannel or microchannel array sidewalls.

Method of Catalyst Application—The MEMS reactors are small devices, typically having a few cubic millimeters of bed volume and massively parallel, high aspect ratio microchannels to maximize surface area. Thus, they are not amenable to crushed catalyst filling methods. It is here that the above-described catalyst preparation methods are beneficial.

A cracked, yet monolithic bed of high surface area sol-gel supported catalyst in the reactor channels is prepared by (1) filling the reactor bed with an aerogel precursor solution containing the support matrix, (2) removing the liquid by either solvent extraction (by exchange with supercritical fluid or evaporation) evaporation, and (3) baking-out the resulting sol-gel at a temperature greater than 500° C. Alternatively, a washcoat slurry of cerin, zirconia or alumina (or other support composition or materials as described previously) with the catalyst salts or hydroxides present (typically about 30% solids) is pushed through the reactor bed, filling it. Thereafter it can be put directly into the bake-out oven where the water boils away, leaving the washcoat coating the walls of the reactor. Variations on this include an air or nitrogen blow-dry after filling the reactor with washcoat, allowing for clean gas passages to be made prior to baking, or freeze drying the washcoat, which keeps the greatest amount of solids in the reactor bed after application. Multiple washcoat/bake-out cycles can be used to increase the amount of catalyst and tortuosity of the gas pathways for maximum reactor efficiency and space velocity. After the bake-out, any post processing, such as elevated temperature reduction over a hydrogen stream, can be performed.

In another embodiment, the catalyst support material is first put into the channels by sol-gel methods and critically dried to coat the channel sidewalls. The catalyst materials are then applied by wash-coating a solution containing the catalyst composition through the channels. In essence, this is a combination of the two previously-described methods. Subsequent baking of the material will further stabilize the catalyst and support materials.

Specific examples of the catalyst system are described below.

EXAMPLE 1

Base Washcoat Preparation

A process description which combines approximately 80% gamma alumina with 20% boehmite alumina is described below. Upon baking at temperatures on the order of 500-600° C., the boehmite goes through a phase transition to form a high surface area gamma alumina structure. The support formulation contains:

28 g Boehmite ($Al_2O_3.H_2O$) powder
112 g gamma alumina ($Al_2O_3$) powder
9.86 g 70% $HNO_3$
168 g distilled $H_2O$ The formulation was mixed on a Cowles mixer for 150 seconds at 1500 RPM with ~200 g 4 mm stainless steel ball media. After mixing, an additional 50 g of distilled $H_2O$ was added, and mixed again for 300 seconds @ 2500 RPM. The resultant material, also referred to as the "base washcoat," was 38% solids.

EXAMPLE 2

Washcoat Injection 5.00 g of the "base washcoat" described in Example 1, 0.90 g Cu(NO3)2.2.5H2O, 1.68 g Zn(NO3)2.6H2O, and 2.00 g 95% ethanol/5% isopropanol were placed in a beaker and mixed thoroughly by hand for 20 minutes into a smooth paste and then transferred into a 5 mL syringe. The paste was then injected into a MEMS microreformer device orifice by the syringe until the device was filled. The device was then blown clear of excess paste by applying a 25 PSI air stream to the inlet orifice for 5 minutes. The microreformer was then baked at 550° C. for 15 minutes. An additional fill, air stream clear and bake cycle was then applied. This yielded 40.6 mg of washcoat on the interior of the microreactor (inside dimensions 100 channels, 100×650×12000 microns).

EXAMPLE 3

Sol-gel Deposition 2.94 g of $Cu(NO_3)_2.2.5H_2O$, 3.66 g of $Zn(NO_3)_2.6H_2O$, and 58.87 g of $Al(NO_3)_3.9H_2O$ were dissolved in 295 g of absolute ethanol to give a clear blue solution. To that solution 72 g of propylene oxide were added. A 5 mL portion of the solution was taken up in a syringe and injected into a MEMS microreforming device orifice until the device was full. Within 10 minutes the solution had changed from a clear blue solution to an opaque blue gel that completely filled the channels of the device. The microreformer was then baked at 550° C. for 2 hours.

EXAMPLE 4

Sol-gel Deposition 2.94 g of $Cu(NO_3)_2.2.5H_2O$, 3.66 g of $Zn(NO_3)_2.6H_2O$, 58.87 g of $Al(NO_3)_3.9H_2O$ were dissolved in 295 g of absolute ethanol to give a clear blue solution. A nitrogen stream containing ammonia vapor was bubbled through the solution to a pH of 9.2. A 5 mL portion of the solution was taken up in a syringe and injected into a MEMS microreforming device orifice until the device was full. The microreformer was then baked at 550° C. for 2 hours.

EXAMPLE 5

Sol-gel Deposition of Alumina Support 58.87 g of $Al(NO_3)_3.9H_2O$ was dissolved in 295 g of absolute ethanol to give a clear colorless solution. To that solution 72 g of propylene oxide were added. A 5 mL portion of the solution was taken up in a syringe and injected into a MEMS microreforming device orifice until the device was full. Within 10 minutes the solution had changed from a clear colorless solution to an opaque white gel that completely filled the channels of the device. The microreformer was then baked at 550° C. for 2 hours. After drying, this process can be repeated to build up successive layers of alumina support. Subsequently a 5 mL portion of a solution of 2.94 g of $Cu(NO_3)_2.2.5H_2O$ and 3.66 g of $Zn(NO_3)_2.6H_2O$ dissolved in 15 mL of ethanol was injected into the device and all of the channels were filled. The wet device was then baked at 550° C. for 15 minutes.

Figure 3:
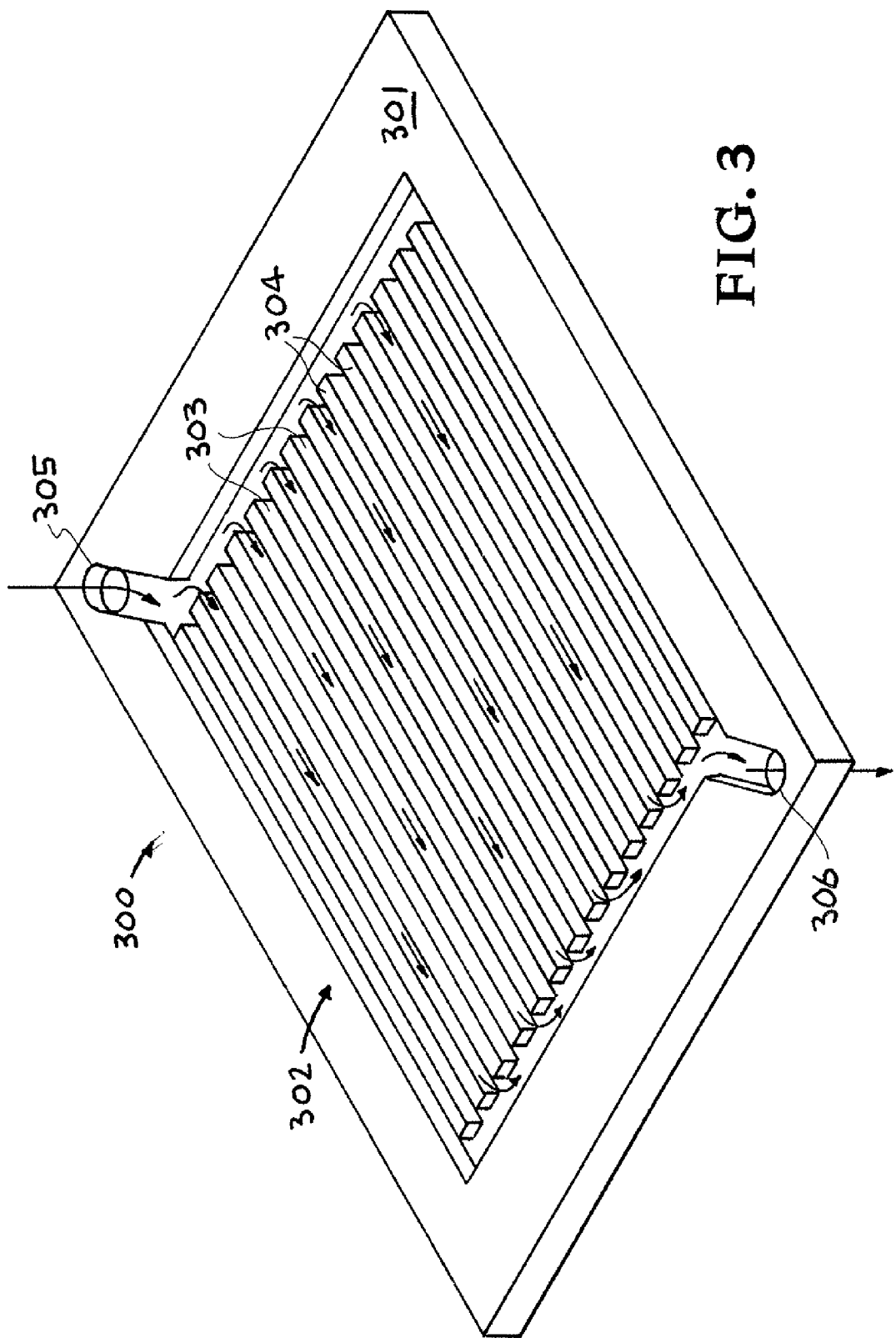
FIG. 3 illustrates an embodiment of a microreactor constructed in accordance with the present invention.

Referring now to FIG. 3, an embodiment of a chemical microreactor constructed in accordance with the present invention is illustrated. The chemical microreactor shown in FIG. 3 is designated generally by the reference numeral 300. The chemical microreactor 300 includes a chemical microreactor section 301. The chemical microreactor section 301 includes a microchannel array 302 having channels and spacings. The microchannels are designated by the reference numeral 303 and the spacings are designated by the reference numeral 304. An inlet 305 and an outlet 306 are connected to the chemical microreactor section 301. The inlet 305 and the outlet 306 are arranged in a symmetrical layout, therefore each flow path has an equivalent pressure drop. The length of the microchannels 303 can be many centimeters, and the limitation is the required pressure drop of the entire array from inlet to outlet. Various embodiments of the present invention provide pressure drops on the order of <1-2 pounds per square inch, sufficient to be controlled by microscale pumps. The microchannel arrays may be arranged or patterned in any of several layouts between the inlet and outlet. While FIG. 3 illustrates an array of straight channels 303, the channels 303 can also be laid out in a serpentine or zig-zag pattern in order to provide some turbulence or mixing of the reactants as they flow along the channels, thereby increasing the interaction with the catalyst coated on the sidewalls.

The chemical microreactor 300 can be used as a miniature fuel cell power source. Miniature fuel cell power sources nominally operate from hydrogen fuel and air, which generate electrical power through a series of electrocatalytic reactions. For portable power applications, it is desirable to have a fuel source which is easy to carry and store, and has high energy density. Such fuel is found in liquid hydrocarbons, such as methanol, ethanol, butane, dimethyl-ether, or propanol. A miniature catalytic fuel processor is then required to convert the hydrocarbon fuel to hydrogen and other byproducts. In order to do so, a chemical microreactor system is required comprising a catalyst bed to be heated, inlet fuel to be evaporated, and subsequent reaction volume and surface area sufficient to process the available reactants at high rates to achieve complete conversion.

In a fuel cell a liquid hydrocarbon fuel is vaporized after which it flows through a catalyst bed that is heated to a nominal reaction temperature. In this case, methanol mixed with water will be used as an example, although the other liquid hydrocarbon fuels cited above can be substituted. The catalyst is a combination reforming and shift catalyst, which provides the following general reactions for methanol:

$$CH_3OH + H_2O \longrightarrow 3H_2 + CO_2 \text{ (reforming, major reaction)} \quad (1)$$

$$CH_3OH \longrightarrow 2H_2 + CO \text{ (decomposition, minor reaction)} \quad (2)$$

$$H_2 + CO_2 \longrightarrow H_2O + CO \text{ (water-gas shift reaction, minor reaction)} \quad (3)$$

The most widely used reforming and shift catalyst for methanol steam reforming is Copper-Zinc Oxide supported on alumina, and several versions are commercially available under the generic label of "shift catalysts." Since the decomposition reaction described above does generate small quantities of carbon monoxide which can poison the anode catalyst of proton exchange membrane fuel cells, a preferential oxidation reaction is typically used after the reforming and decomposition reactions to further reduce the levels of carbon monoxide in the fuel feed to levels which are tolerable to the fuel cell anode catalyst. This reaction combines the fuel feed with an air or oxygen stream in which the molar ratio of oxygen to carbon monoxide in the fuel stream is roughly between 1 and 2. The catalyst, which may consist of ruthenium, iridium, platinum, cobalt, tin, or combinations or oxides thereof on a high surface area alumina support, is heated to a nominal temperature at which approximately equal molar amounts of carbon monoxide and hydrogen are oxidized to carbon dioxide and water; however, since the amount of hydrogen in the reformate is much larger than that of carbon monoxide, there is no significant depletion of hydrogen. The preferential oxidation (PROX) reaction is exothermic and will self heat once reactions are initiated. The optimal temperature to selectively remove the carbon monoxide from the fuel stream is typically much lower than the reforming temperature. The reforming temperature is, for example, 70-140° C. for a Ruthenium based PROX catalyst, versus 250-300° C. for a Copper-Zinc Oxide based reforming catalyst. Typically, carbon monoxide levels on the order of 1% in the fuel feed can be reduced to levels less than 100 parts per million (0.01%). Next the fuel feed goes to the fuel cell. Since carbon dioxide makes up about 25% of the fuel feed, an air stream is added to the anode inlet to further oxidize any carbon monoxide generated with the anode manifold of the fuel cell due to a. backshift reaction.

For fuel processors, thermal balance and balance of plant for the system are critical design issues. The reforming catalyst bed must be heated up and maintained at an operating temperature of 250-300° C. for steam reforming of methanol, although depending on the catalyst and fuel, this temperature may be higher, up to 400° C. for methanol, and up to 650° C. for butane, or methane. The incoming fuel stream must be evaporated and heated to the operating temperature, the exhaust stream of processed fuel must be cooled to minimize loss of heat prior to being mixed with the air stream in the PROX reactor, and the incoming air stream must be preheated so it doesn't cool the reactant gases in the PROX reactor. While some form of electrical heating may be satisfactory for electrical startup, this is inefficient for long term heating of the catalyst bed.

Typical means for heating the reformer bed use a catalytic combustor that combines fuel (hydrogen or hydrocarbon) with air as it passes over a separate catalyst bed. The catalyst is typically a platinum or platinum on alumina support. When the oxygen and hydrogen pass over the catalyst, the catalytic reaction is exothermic, therefore is a very efficient source of heat. The combustor catalyst bed is in thermal communication with the reformer and the incoming fuel stream, and provides the necessary heat of reaction for reforming. Additionally, the heat generated by the combustor can be controlled by balancing the flows of either air or fuel, or both, that flow into the combustor. Heat exchangers are used to preheat the air and fuel reactant streams in order to efficiently balance the thermal management of the system. Additional use of thermal insulation is incorporated as necessary depending on the amount of heat loss for the system.

Figure 4:
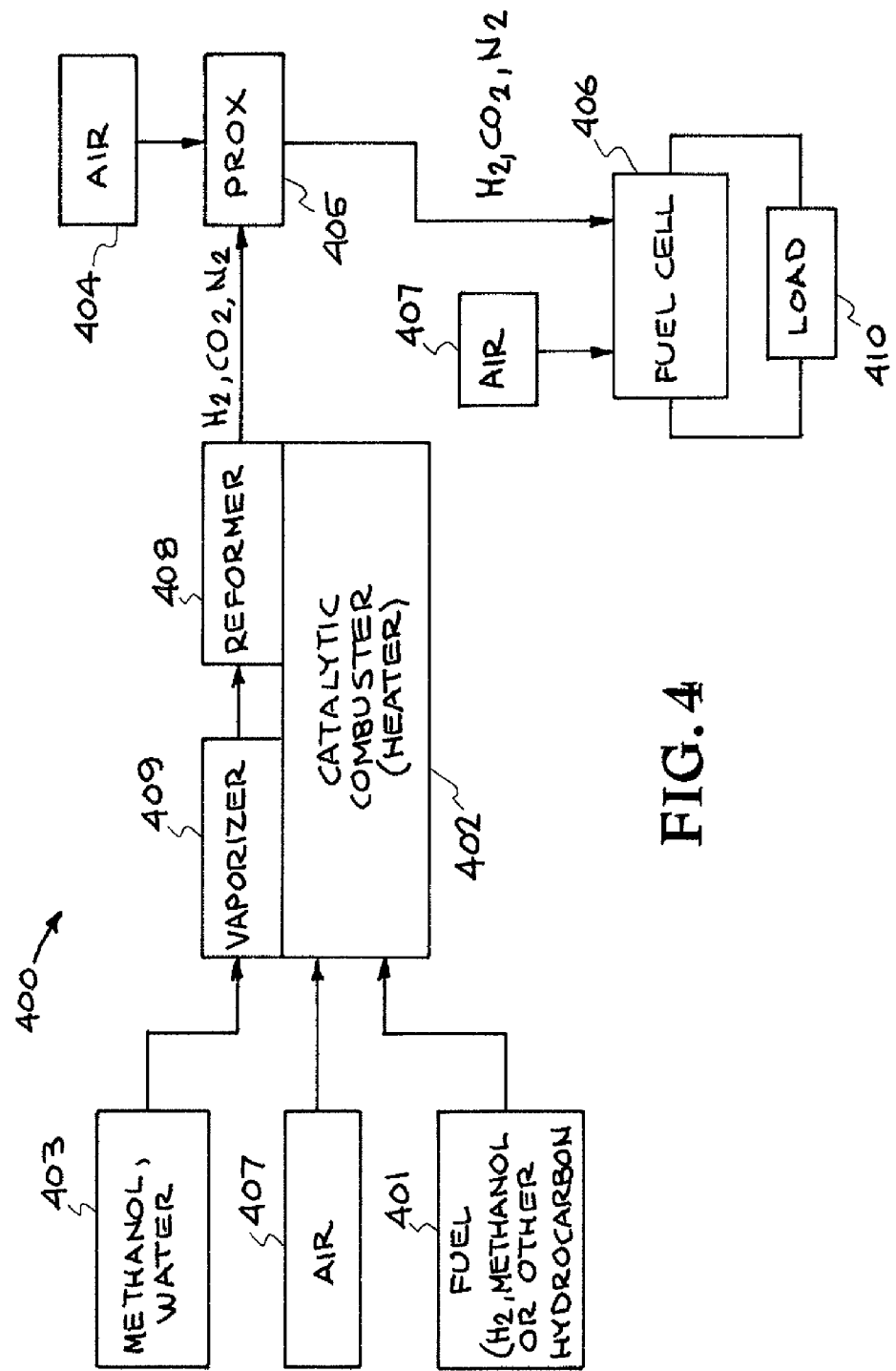
FIG. 4 illustrates a fuel processor system that utilizes a number of microreactors constructed in accordance with the present invention.

Referring now to FIG. 4, a fuel processor system that utilizes a number of chemical microreactors is illustrated. The overall system is designated generally by the reference numeral 400. In the system 400, a first chemical microreactor is used in the catalytic combustor 402, a second chemical microreactor is used in the reformer 408, a third chemical microreactor is used in the PROX 405, and a fourth chemical microreactor is used in the vaporizer 409. The chemical microreactors in the system 400 are microelectromechanical systems (MEMS) and micromachining fabrication techniques are utilized to form intricate three-dimensional fluidic structures within a microchip substrate to produce the microreactors.

The catalytic combustor 402 provides a heating system for the vaporizer 409 and the reformer 408. In the heating system a liquid hydrocarbon fuel 401 is vaporized after which it flows through a catalyst bed that is heated to a nominal reaction temperature. Air 407 flows into the catalyst bed of the catalytic combustor 402. A chemical microreactor section is part of the catalytic combustor 402. The chemical microreactor section includes channels. Methanol mixed with water 403 is vaporized in vaporizer 409 and directed into the reformer 408. Methanol mixed with water is used as an example, although the other liquid hydrocarbon fuels can be substituted. The catalyst is a combination reforming and shift catalyst, which provides the general reaction for methanol

$$CH_3OH + H_2O \rightarrow 3H_2 + CO_2 \qquad (4)$$

The optimal reforming and shift catalyst for methanol steam reforming is Copper-Zinc Oxide supported on alumina, and several versions are commercially available.

Since the reaction described above can generate small quantities of carbon monoxide which can poison the anode catalyst of proton exchange membrane chemical microreactors, a preferential oxidation reaction, PROX 405 is typically used after the reforming and shift reactions to further reduce the levels of carbon monoxide in the fuel feed to levels which are tolerable to the chemical microreactor anode catalyst. This reaction combines the fuel feed with an air 404 or oxygen stream in which the ratio of oxygen to carbon monoxide molecules in the fuel stream is between about 1 and about 2.

The catalyst, which may consist of Ruthenium, Iridium, platinum, cobalt, tin, or combinations or oxides thereof on a high surface area alumina support, is heated to a nominal temperature at which the carbon monoxide is selectively oxidized to carbon dioxide without reacting hydrogen at any significant levels. The preferential oxidation (PROX) reaction 405 is typically somewhat exothermic, thus will self heat once reactions are initiated.

The optimal temperature to selectively remove the carbon monoxide from the fuel stream is typically much lower than the reforming temperature, for example, 70-140° C. for a Ruthenium based PROX catalyst, versus 250-300° C. for a Copper-Zinc Oxide based reforming catalyst. Typically, carbon monoxide levels on the order of 1% in the fuel feed can be reduced to levels less than 100 parts per million (0.01%).

For fuel processors, thermal balance of the system is a critical design issue. The reforming catalyst bed must be heated up and maintained at an operating temperature of 250-300° C. for steam reforming of methanol, although depending on the catalyst and fuel, this temperature may be higher, up to 400° C. for methanol, and 650° C. for butane, propane, or methane. The incoming fuel stream must be evaporated and heated to the operating temperature, the exhaust stream of processed fuel must be cooled to minimize loss of heat prior to being mixed with the air stream 404 in the PROX reactor 405, and the incoming air stream 404 must be preheated so it doesn't cool the reactant gases in the PROX reactor 405. A chemical microreactor section is part of the PROX reactor 405. The chemical microreactor section includes channels.

The output of the PROX reactor 405 is directed into a fuel cell 406. Air 407 is also directed into the fuel cell. Power is produce by the fuel cell 406 and the power can be used by the load 410.

In the system 400 shown in FIG. 4, while some form of electrical heating may be satisfactory for electrical startup, this is inefficient for long term heating of the catalyst bed. Typical means for heating the reformer bed uses a catalytic combustor which combines fuel (hydrogen or hydrocarbon) with air as it passes over a separate catalyst bed. The catalyst is typically a platinum or platinum on alumina support. When the oxygen and hydrogen pass over the catalyst, the catalytic reaction is exothermic, therefore is a very efficient source of heat. The combustor catalyst bed is in thermal communication with the reformer and the incoming fuel stream, thereby provides the necessary heat of reaction for reforming.

Additionally, the heat generated by the combustor can be controlled by controlling or balancing the flows of either air or fuel, or both, flowing into the combustor. Heat exchangers are used to preheat the air and fuel reactant streams in order to efficiently balance the thermal management of the system. Additional use of thermal insulation is incorporated as necessary depending on the amount of heat loss for the system.

Figure 5:
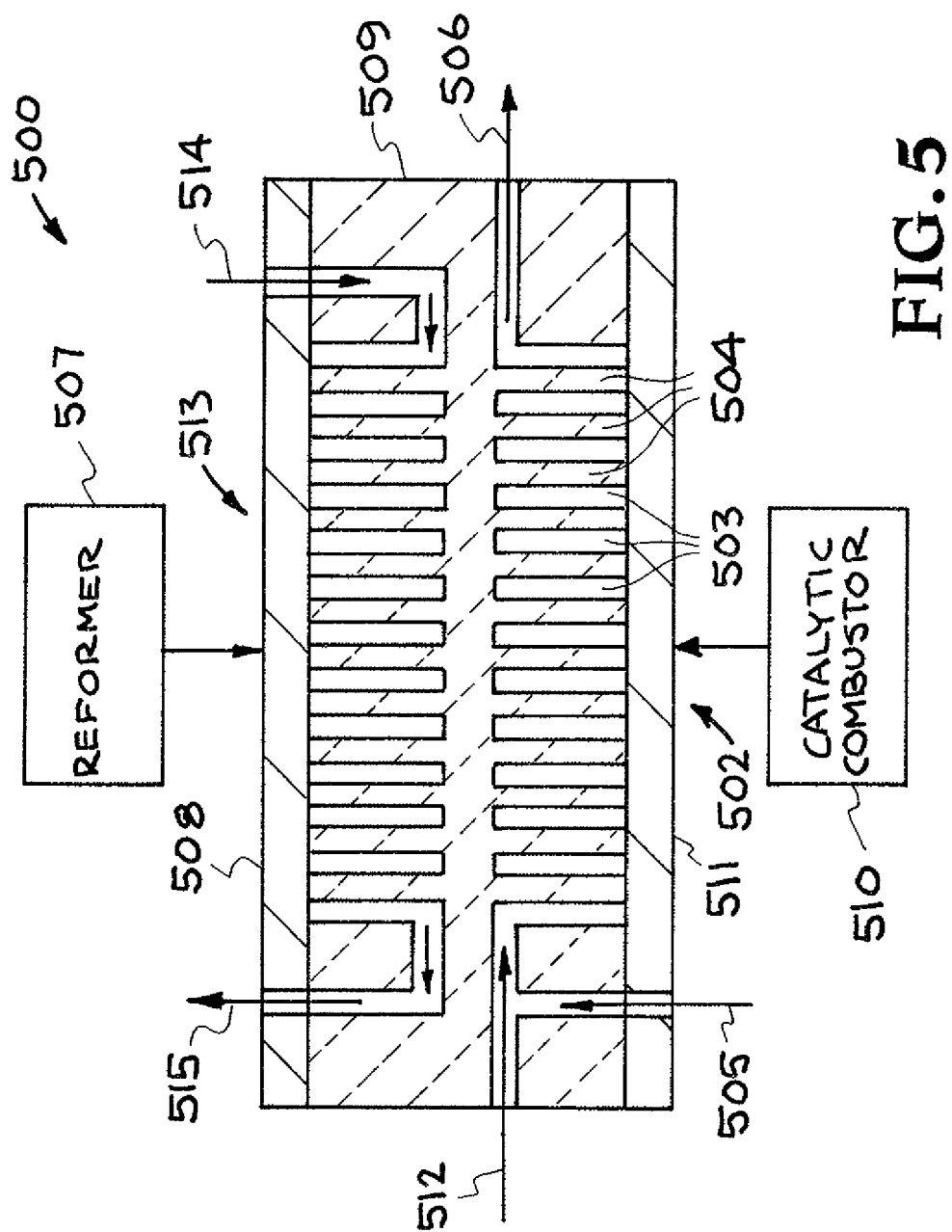
FIG. 5 illustrates another embodiment of a microreactor constructed in accordance with the present invention.

Referring now to FIG. 5, another embodiment of a chemical microreactor constructed in accordance with the present invention is illustrated. This embodiment is designated generally by the reference numeral 500. The system 500 is a microelectromechanical system (MEMS) and micromachining fabrication techniques are utilized to form intricate three-dimensional fluidic structures within a microchip substrate 509.

In the system 500, a reformer 507 is formed in the topside 508 of the silicon substrate 509, and a catalytic combustor 510 is formed in bottom 511 of the same substrate 509. This is achieved by first patterning and etching the top side 508, then patterning and etching the bottom 511. The etch depths into the silicon substrate 509 are controlled such that the distance remaining between the two arrays of microchannels on each side of the substrate 509 are on the order of 50-250 µm. This provides efficient thermal coupling between the catalytic combustor 510 heat source and the reformer 507, which is endothermic. Wafer bonding is used to form the enclosed microchannel arrays with independent inlet and outlet vias. The reformer 507 includes a microchannel array 513. Fuel is introduced to the reformer 507 through inlet 514 and the converted fuel emerges through outlet 515.

The combustor 510 includes a microchannel array 502 having channels with a height and spacings with a width. The channels are designated by the reference numeral 503 and the spacings are designated by the reference numeral 504. The channels 503 have a surface area and there is a volume in said channels. The channels have a high surface area to volume ratio.

The chemical microreactor section 510 includes a fuel inlet 505, an air inlet 512, and an exhaust outlet 506. The length of the microchannels 503 can be many centimeters, and the limitation is the required pressure drop of the entire array from inlet to outlet. Various embodiments of the present invention provide pressure drops on the order of <1-2 pounds per square inch, sufficient to be controlled by microscale pumps. The microchannel arrays may be arranged or patterned in any of several layouts between the inlet and outlet. While FIG. 5 illustrates an array of straight channels 503, the channels 503 can also be laid out in a serpentine or zig-zag pattern in order to provide some turbulence or mixing of the reactants as they flow along the channels, thereby increasing the interaction with the catalyst coated on the sidewalls.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A method of producing a microreactor, comprising the steps of:
providing a silicon wafer,
coating a photoresist on said silicon wafer,
using a mask with UV exposure to develop a desired pattern in said photoresist,
anisotropic etching said silicon wafer to produce microchannels in said silicon wafer,
applying a liquid containing a catalyst to said microchannels filling said microchannels with said liquid containing a catalyst,
aligning a substrate over said microchannels in said silicon wafer wherein said step of aligning a substrate over said microchannels in said silicon wafer comprises aligning a silicon wafer substrate or a glass substrate over said microchannels in said silicon wafer,
allowing surface tension to spread said liquid containing a catalyst over said microchannels by surface tension,
bonding said silicon wafer and said substrate, and
baking microchannels, said liquid, and said catalyst leaving said catalyst in said microchannels coating said microchannels with said catalyst.

2. The method of producing a microreactor of claim 1 wherein said step of aligning a substrate over said microchannels in said silicon wafer comprises aligning a silicon wafer substrate over said microchannels in said silicon wafer.

3. The method of producing a microreactor of claim 1 wherein said step of aligning a substrate over said microchannels in said silicon wafer comprises aligning a glass substrate over said microchannels in said silicon wafer.

4. The method of producing a microreactor of claim 1 wherein said step of bonding said silicon wafer and said substrate comprises anodic bonding or fusion bonding.

5. The method of producing a microreactor of claim 1 wherein said step of bonding said silicon wafer and said substrate comprises anodic bonding.

6. The method of producing a microreactor of claim 1 wherein said step of bonding said silicon wafer and said substrate comprises fusion bonding.

7. The method of producing a microreactor of claim 1 wherein said microchannels comprise a multiplicity of individual microchannels with each michrochannel having an end, and wherein said step of applying a liquid containing a catalyst to said microchannels filling said microchannels with said liquid containing a catalyst comprises applying a liquid containing a catalyst to said end of said michrochannel.

8. The method of producing a microreactor of claim 1 wherein said microchannels comprise a multiplicity of individual microchannels with each michrochannel having an end, and wherein said step of applying a liquid containing a catalyst to said microchannels filling said microchannels with said liquid containing a catalyst comprises applying a liquid containing a catalyst to said end of said michrochannel and closing said end of said michrochannel whereby said liquid containing a catalyst is wetted onto said microchannel by surface tension providing uniform coating of said microchannel through capillary forces.

9. The method of producing a microreactor of claim 1 wherein said microchannels comprise a multiplicity of individual microchannels with each michrochannel having an inlet and an outlet, and wherein said step of applying a liquid containing a catalyst to said microchannels filling said microchannels with said liquid containing a catalyst comprises applying said liquid containing a catalyst to said inlet and allowing said liquid containing a catalyst to flow to said outlet.

10. The method of producing a microreactor of claim 1 wherein said microchannels comprise a multiplicity of individual microchannels with each michrochannel having an inlet and an outlet, and wherein said step of applying a liquid containing a catalyst to said microchannels filling said microchannels with said liquid containing a catalyst comprises applying a liquid containing an aerogel catalyst to said microchannels filling said microchannels with said liquid containing an aerogel catalyst.

11. The method of producing a microreactor of claim 1 wherein said microchannels comprise a multiplicity of individual microchannels with each michrochannel having an inlet and an outlet, and wherein said step of applying a liquid containing a catalyst to said microchannels filling said microchannels with said liquid containing a catalyst comprises applying a liquid containing an solgel catalyst to said microchannels filling said microchannels with said liquid containing a solgel catalyst.

12. The method of producing a microreactor of claim 1 wherein said microchannels comprise a multiplicity of individual microchannels with each michrochannel having an inlet and an outlet, and wherein said step of applying a liquid containing a catalyst to said microchannels filling said microchannels with said liquid containing a catalyst comprises applying a liquid containing a zeolite catalyst to said microchannels filling said microchannels with said liquid containing a zeolite catalyst.

13. The method of producing a microreactor of claim 1 wherein said microchannels comprise a multiplicity of individual microchannels with each michrochannel having an inlet and an outlet, and wherein said step of applying a liquid containing a catalyst to said microchannels filling said microchannels with said liquid containing a catalyst comprises applying a liquid containing an an aerogel of zirconia, or alumina, or ceria, or calcia or silica, and combinations of zirconia, or alumina, or ceria, or calcia or silica to said microchannels filling said microchannels with said liquid containing an aerogel of zirconia, or alumina, or ceria, or calcia or silica, and combinations of zirconia, or alumina, or ceria, or calcia or silica.

14. The method of producing a microreactor of claim 1 wherein said microchannels comprise a multiplicity of individual microchannels with each michrochannel having an inlet and an outlet, and wherein said step of applying a liquid containing a catalyst to said microchannels filling said microchannels with said liquid containing a catalyst comprises applying a liquid containing copper, or zinc, or zirconium, or nickel, or chromium, or cobalt, or cerium, or silicon, or silica, or titanium, or aluminum nitrates, acetates, chlorides, oxychlorides or other soluble salts, or oxides thereof to said microchannels filling said microchannels with said liquid containing coating said microchannels with copper, or zinc, or zirconium, or nickel, or chromium, or cobalt, or cerium, or silicon, or silica, or titanium, or aluminum nitrates, acetates, chlorides, oxychlorides or other soluble salts, or oxides thereof.

* * * * *